(12) United States Patent
Lin et al.

(10) Patent No.: US 9,379,277 B2
(45) Date of Patent: Jun. 28, 2016

(54) FABRICATION METHOD FOR SOLAR CELL ASSEMBLY

(71) Applicant: Changzhou Almaden Co., Ltd., Changzhou (CN)

(72) Inventors: Jinxi Lin, Changzhou (CN); Jinhan Lin, Changzhou (CN); Yuting Lin, Wufeng Township (TW)

(73) Assignee: Changzhou Almaden Co., Ltd., Changzhou (CN)

( * ) Notice: Subject to any disclaimer, the term of this patent is extended or adjusted under 35 U.S.C. 154(b) by 134 days.

(21) Appl. No.: 14/162,450

(22) Filed: Jan. 23, 2014

(65) Prior Publication Data

US 2014/0209236 A1    Jul. 31, 2014

(30) Foreign Application Priority Data

Jan. 25, 2013 (CN) .......................... 2013 1 0030009

(51) Int. Cl.
*B29C 41/14* (2006.01)
*H01L 31/048* (2014.01)
*H01L 31/042* (2014.01)
(Continued)

(52) U.S. Cl.
CPC ........ *H01L 31/182* (2013.01); *B29C 45/14819* (2013.01); *H01L 31/042* (2013.01); *H01L 31/048* (2013.01); *H01L 31/0481* (2013.01); *H01L 31/0488* (2013.01); *B29C 2045/14942* (2013.01); *Y02E 10/542* (2013.01)

(58) Field of Classification Search
CPC .............. H01L 31/048; H01L 31/0481; H01L 31/0488; H01L 31/049; H01L 25/042; B29C 45/14819; B29C 45/14655; B29C 2045/14942
See application file for complete search history.

(56) References Cited

U.S. PATENT DOCUMENTS

| 4,830,038 | A | * | 5/1989 | Anderson | ......... B29C 45/14336 |
|---|---|---|---|---|---|
| | | | | | 136/251 |
| 5,743,970 | A | * | 4/1998 | Czubatjy | ........... B29C 45/14639 |
| | | | | | 136/251 |
| 2002/0148496 | A1 | * | 10/2002 | Dorner | ................ B32B 17/1077 |
| | | | | | 136/243 |

(Continued)

FOREIGN PATENT DOCUMENTS

| CN | 1653558 A | 8/2005 |
|---|---|---|
| CN | 101115787 A | 1/2008 |

(Continued)

OTHER PUBLICATIONS

European Search Report for Application EP 14 15 2252 dated Apr. 17, 2014.

(Continued)

*Primary Examiner* — William Bell
(74) *Attorney, Agent, or Firm* — Drinker Biddle & Reath LLP

(57) ABSTRACT

A fabrication method for a solar cell assembly is disclosed. Solar cell sheets, which are connected to each other with connecting sheets, are placed into an injection mold having casting molds. The solar cell sheets are respectively situated in the casting molds. An injection molding material is injected into the casting molds under a heating condition such that the solar cell sheets are encapsulated in the injection molding material. The injection molding material can include ethylene-vinyl acetate or polysilicone and polyvinyl butyral. The encapsulated solar cell sheets are taken out of the injection mold. A substrate and a back sheet respectively are attached to two sides of the encapsulated solar cell sheets.

11 Claims, 1 Drawing Sheet

(51) Int. Cl.
*H01L 31/18* (2006.01)
*B29C 45/14* (2006.01)

(56) References Cited

U.S. PATENT DOCUMENTS

| | | | |
|---|---|---|---|
| 2005/0263182 A1* | 12/2005 | Morooka | H01B 1/122 136/263 |
| 2011/0091707 A1 | 4/2011 | Jousset et al. | |
| 2011/0241147 A1 | 10/2011 | Tu et al. | |

FOREIGN PATENT DOCUMENTS

| | | | | |
|---|---|---|---|---|
| CN | 101232054 A | | 7/2008 | |
| CN | 101924164 A | | 12/2010 | |
| DE | 102009051051 A1 | | 5/2011 | |
| EP | 2388830 A1 | | 11/2011 | |
| FR | 2583923 A1 | * | 12/1986 | ............. B29C 39/10 |
| JP | 05090625 A | * | 4/1993 | |
| TW | 201135923 A | | 10/2011 | |
| WO | WO-2011010076 A2 | | 1/2011 | |

OTHER PUBLICATIONS

Chinese Office Action for corresponding Chinese Patent Application No. 201310030009.2 dated Oct. 19, 2015.
Search Report for ROC (Taiwan) Patent Application No. 103102517 (along with English language translation).

* cited by examiner

FABRICATION METHOD FOR SOLAR CELL ASSEMBLY

CROSS REFERENCE TO RELATED APPLICATIONS

This application claims benefit under 35 USC 119(e) to Chinese Application No. 201310030009.2, filed on Jan. 25, 2013, which is incorporated herein by reference in its entirety.

BACKGROUND OF THE INVENTION

1. Field of the Invention

The subject invention relates to a fabrication method for solar cell assembly, and particularly to a fabrication method for solar cell assembly by using a thermal injection molding process instead of a lamination process.

2. Description of the Related Art

Solar cells which are mostly made from single crystal silicon or poly-crystal silicon are eco-friendly and economical energy alternative, and have become prevalently used in daily life, and for their better and more efficient use, developing large and thin solar cells is needed. Their fragility and thin proportions make them particularly susceptible to damage from strong impacts. Since solar cell electrodes cannot be exposed to the surroundings for a long time during operation, and the working voltage of each individual solar cell is low. It is necessary to connect a plurality of individual solar cells in series or parallel and encapsulate them into a solar cell assembly which may be used independently as a power unit.

The methods presently employed for fabricating solar cells are quite similar. Connecting sheets composed of conductive materials such as copper are used to connect and solder a plurality of solar cell sheets in a discontinuous series manner to form a row of solar cell sheets. Rows of solar cell sheets are connected in parallel to form several sets of solar cell sheets. The following components are laminated from the bottom to the top: a front substrate, such as glass; an encapsulation material; several sets of solar cell sheets; an encapsulation material and a back substrate, such as composite fluoride plastic film (such as commercial available TPT film). The lamination is put into a vacuum laminator and subjected to a vacuum lamination process. The lower chamber of the laminator is vacuumized and then pressurized and heated to integrate the lamination of glass substrate/encapsulation materials/several sets of solar cell sheets/encapsulation materials/back substrate. After the lamination takes shape, the lamination is taken out from the chamber and equipped with a metal frame. A solar cell assembly is obtained.

Conventional lamination processes integrate laminations by performing heating and pressurization treatments. However, pressurization treatments tend to cause deformation, damage and cracking in solar cell sheets. Moreover, when the environment is heated to a temperature above 120° C. during the lamination process, ethylene-vinyl acetate encapsulation materials may be softened, giving rise to the overlapping of parallel-aligned sets of solar cell sheets and diminished efficiency of the solar cell assembly. Further, the toughened transparent glass substrate, which is commonly used in a solar cell assembly, often has a thickness over 3.2 mm and poor surface smoothness after a toughening process. When a solar cell assembly is fabricated by a lamination process with two such toughened glass substrates, the solar cell sheets of a thickness of only 180 to 200 μm tend to break due to the weight and poor surface smoothness of the glass substrates. Therefore, the conventional lamination process is not suitable for encapsulating a solar cell assembly with a transparent glass back substrate and particularly unsuitable for encapsulating large solar cells. Besides, lamination of encapsulation materials is mostly carried out manually. Due to the inaccuracy resulting from manual operation, bubbles tend to be observed in the encapsulation materials and thus render the product uniformity of solar cell assemblies rather poor and the quality of solar cell assemblies unstable. Further, such manual operation also creates problems such as material waste and environmental pollution, and suffers inherently limited productivity.

The subject invention is provided to meet the increasing need for large solar cells, which refer to those having an area greater than 1 square meter, and to address the aforementioned problems. The inventors of the subject application discovered that fabricating solar cell assemblies with a thermal injection molding process instead of the conventional lamination process and using specific equipment and encapsulation materials may avoid the inaccuracies resulting from manual operation, drastically boost the productivity of the process and efficiently reduce the cracking defects in solar cell sheets. The lifetime of a solar cell assembly is also prolonged. The fabrication method of the subject invention is suitable for large and thin solar cells.

SUMMARY OF THE INVENTION

The objective of the present invention is to provide a fabrication method for solar cell assemblies which have higher product uniformity, more stable product quality and longer lifetime.

The method of the subject invention uses a thermal injection molding process instead of the conventional lamination process for encapsulating solar cells assemblies. The method of the subject invention is particularly suitable for large solar cell assemblies. By applying the method of the subject invention, fewer broken solar cells are found in the fabricated solar cell assembly, the electrical performance of the solar cell assembly is improved, and thus the lifetime thereof is prolonged. Further, the solar cell encapsulation of the subject invention is carried out by a thermal injection molding process and with specific encapsulation materials which are automatically injected into injection molds to cover the solar cells sheets. Automatic machine production results in better product uniformity and more stable product quality, drastically boosts productivity and lowers the cost of encapsulation. Thus, a more competitive product is provided

PREFERRED EMBODIMENTS OF THE PRESENT INVENTION

In this context, unless otherwise limited, a singular term (such as "a") also includes a plural form thereof. In this context, all embodiments and exemplary terms (for example, "such as") only aim at making the present invention more prominent, but are not intended to limit the scope of the present invention; terms in this specification should not be construed as implying that any component not claimed may form a necessary component for implementing the present invention.

The fabrication method for a solar cell assembly of the subject invention includes the following steps:

placing a plurality of solar cell sheets, which are connected to each other with connecting sheets, into an injection mold having a plurality of casting molds such that said plurality of solar cell sheets are respectively situated in said plurality of casting molds;

injecting an injection molding material into said plurality of casting molds under a heating condition such that said solar cell sheets are encapsulated in said injection molding material, wherein said injection molding material is selected from a group consisting of ethylene-vinyl acetate, polysilicone and polyvinyl butyral (PVB);

taking the encapsulated plurality of solar cell sheets out of said injection mold; and attaching a substrate and a back sheet respectively to two sides of said encapsulated plurality of solar cell sheets.

The method of the subject invention further comprises connecting several sets of solar cell sheets formed from a plurality of solar cell sheets with connection threads before injecting an injection molding material or after taking out the encapsulated plurality of solar cell sheets.

The subject invention is illustrated with the following preferred embodiments of the subject invention.

The shape and dimension of an injection mold and casting molds of the subject invention can be easily understood and modified by a person of ordinary skill in the art based on those exemplified by the subject invention, preferably depending on the shape and dimension of solar cell sheets. The injection mold and casting molds are made from materials such as thermoplastic materials, thermosetting materials or metals. The injection mold of the subject invention is preferably positioned in a horizontal or vertical position.

Figure 1A:
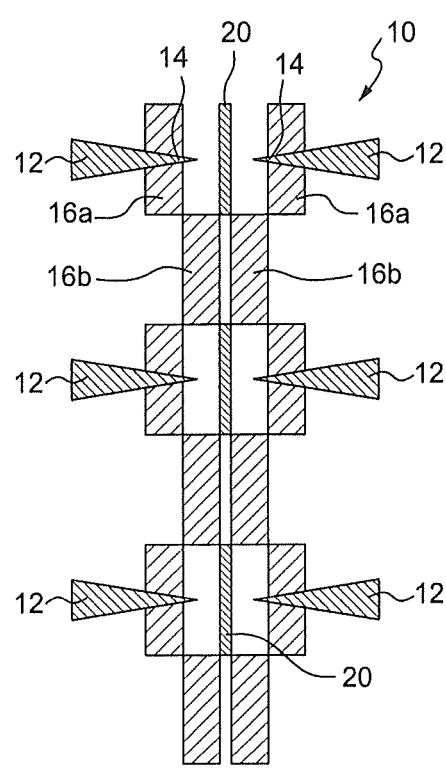
FIG. 1A and FIG. 1B show the injection moldmolds suitable for the method of the subject invention.
Figure 1B:
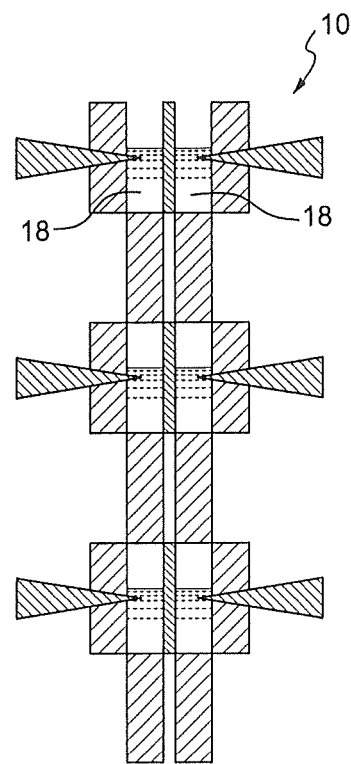

FIG. 1A and FIG. 1B show the injection mold suitable for the method of the subject invention.

As shown in FIG. 1A, an injection mold 10 of the subject invention has runners 12 for injection, gates 14 and casting molds 16a and 16b, wherein the casting mold 16a is used for placing a solar cell sheet 20, and the casting mold 16b is used for placing connecting sheets (not shown in the figure) connecting the solar cell sheets 20. Said injection mold 10 further comprises heating, cooling and ejection devices (now shown in the figure) to facilitate the molding, cooling and demolding of the solar cell sheet 20.

As shown in FIG. 1B, the injection molding step in the method of the subject invention comprises closing the injection mold 10 with solar cell sheets situated therein and putting said injection mold into a vertical position. Under a heating condition, an injection molding material 18 is injected through runners and gates to fill the casting molds. The injection mold is sufficiently cooled to room temperature, and the pressure is maintained at about 1 atm to compensate for material shrinkage. A cooling agent such as water may be used to cool the injection mold. The injection mold opens to eject a finished product.

The injection molding step of the subject invention comprises two heating stages, one is a low temperature injection molding process, and the other one is a high temperature cross-linking process. In the subject invention, the temperature in said low temperature injection molding process is in a range of 70° C. to 130° C., preferably 100° C. to 120° C. The temperature in said high temperature cross-linking process is in a range of 120° C. to 200° C., preferably 140° C. to 180° C.

In one embodiment of the subject invention, said injection molding step is performed under a vibration condition. Said vibration condition is selected from a group consisting of mechanical vibration, sonic vibration, ultrasonic vibration and electromagnetic vibration. Ultrasonic vibration injection molding is preferred, and ultrasonic vibration thermal injection molding is more preferred. A vibration condition is adopted to enhance the completion of the molding of the injection molding material through applied forces. The fluidity of the injection molding material increases, and thus the mold-filling viscosity, injection molding pressure and injection velocity decreases. Less internal stress is formed, and gases tend to be eliminated. Such phenomena are advantageous to the encapsulation of solar cell sheets with an injection molding material. Therefore, the product quality is improved, and the lifetime of the injection molding machine is prolonged.

The solar cell sheets used in the method of the subject invention are conventional to a person of ordinary skill in the art. In one embodiment of the subject invention, the solar cell sheets are selected from the group consisting of single silicon solar cell sheets, polysilicon solar cell sheets, amorphous silicon solar cell sheets, potassium arsenide solar cell sheets, cadmium telluride solar cell sheets, copper indium selenium solar cell sheets, copper indium gallium selenium solar cell sheets and dye sensitized solar cell sheets. The solar cell sheets are connected by connecting threads in parallel or series, and the threads are gathered to lead terminals.

In the method of the subject invention, an injection molding material selected from a group consisting of ethylene-vinyl acetate (EVA), polysilicone and polyvinyl butyral (PVB) is used to encapsulate solar cell sheets between a substrate and a back sheet. Advantageously, these materials are moisture resistant and remain light transmissive after being heated and cross-linked. Thus, these materials are suitable to be used as the injection molding material of the injection molding process of the subject invention. Further, compared to regular plastic materials such as acrylonitrile-styrene copolymer (AS), polystyrene (PS), polypropylene (PP), polycarbonate (PC) and polyethylene terephthalate (PET), said injection molding materials have strong resistance against moisture, high light transmission, good electrical insulation, resistance against acid and base solutions and certain after-molding rigidity. Such properties are particularly suitable for the fabrication of large solar cells, such as a solar cell of an area greater than 1 square meter. The substrate and back sheet used in the method of the subject invention are conventional to a person of ordinary skill in the art and can be individually made from materials such as, but not limited to, glass, polymer, plastics, stainless steel, aluminum and composite materials. In one embodiment of the subject invention, the substrate is a glass substrate, and the back sheet is a glass back sheet or a polymer back sheet.

Before the substrate and back sheet are attached, the method of the subject invention further comprises encapsulating solar cells with a side wall encapsulation material, which may be selected from, though not limited to, a group consisting of organic silicon gel and butyl rubber sealing strips.

The method of the subject invention carries out the encapsulation of solar cell by a thermal injection molding process rather than the conventional lamination process. The damage and cracking of solar cell sheets resulting from pressurization are reduced. Automatic production prevents contamination and provides better product uniformity and more stable product quality. The productivity and electro performance of a solar cell assembly are enhanced, and the lifetime thereof is prolonged. The method of the subject invention is particularly suitable for the fabrication of a large solar cell assembly. The deformation and cracking of solar cell sheets my be prevented when attempts are made to fabricate a flexible or bendable solar cell assembly. Further, for a large scale solar cell assembly fabricated by the method of the subject invention, glass, which has better light transmission, may be adopted as a back sheet to efficiently increase its performance and widen the range of applications.

One or more embodiments of the subject invention are illustrated in the following descriptions. According to these descriptions and the claims, the other features, objects and advantages of the subject invention will be easily understood.

EXAMPLE 1

A plurality of polysilicon solar cell sheets are soldered in series by connecting sheets to form a series of solar cell sheets. The series of solar cell sheets is positioned into an injection mold having a plurality of casting molds such that a plurality of solar cell sheets and connecting sheets are respectively situated in the casting molds. The injection mold is positioned horizontally into an ultrasonic vibrator. The pressure is maintained at 1 atm. The injection mold is heated to about 80° C. to 100° C. Ethylene-vinyl acetate is injected into said plurality of casting molds. The injection mold is maintained under such condition for about 5 to 10 minutes. The injection mold is then heated to about 130° C. to 150° C. and maintained for about 3 to 5 minutes such that the ethylene-vinyl acetate crosslinks and cures to encapsulate the solar cell sheets. Cured ethylene-vinyl acetate becomes completely transparent and is characterized by considerably high light transmission. Then, the injection mold is placed into water to be sufficiently cooled, and the series of encapsulated solar cells sheets is taken out of the injection mold. A plurality of series of solar cell sheets are connected with connecting threads. A glass substrate and a glass back sheet are respectively attached to two sides of the solar cell sheets, and a metal frame is equipped to obtain a solar cell assembly.

The method of the subject invention uses a thermal injection mold to encapsulate the solar cell sheets with an injection molding material sheet by sheet. Solar cell sheets of the subject invention may be prevented from cracking, which often occurs in the lamination of the conventional lamination process due to pressure from the upper and lower sides of the lamination. Meanwhile, the junction of the electrodes of solar cell sheets with the connecting sheets and the connecting threads may be prevented from breakage or separation that commonly occurs in assembly processes and due to external drag forces. The tendency for gas to be produced in the lamination process may be eliminated.

Although illustrative embodiments have been described in reference to the subject invention, it should be understood that features which can be easily modified or adjusted by a person of ordinary skill in the art would fall into the scope of the specification of the subject application and the claims attached thereto.

What is claimed is:

1. A fabrication method for a solar cell assembly, comprising the following steps:
    placing a plurality of solar cell sheets, which are connected to each other with connecting sheets, into an injection mold having a plurality of casting molds such that said plurality of solar cell sheets are respectively situated in said plurality of casting molds;
    injecting an injection molding material into said plurality of casting molds under a heating condition such that said solar cell sheets are encapsulated in said injection molding material, wherein said injection molding material is selected from a group consisting of ethylene-vinyl acetate, polysilicone and polyvinyl butyral;
    taking the encapsulated plurality of solar cell sheets out of said injection mold; and
    attaching a substrate and a back sheet respectively to two sides of said encapsulated plurality of solar cell sheets.

2. The fabrication method according to claim 1, wherein said injection mold is positioned in a horizontal or vertical position.

3. The fabrication method according to claim 1, wherein said heating condition includes two heating stages, one is a low temperature injection molding process, and the other one is a high temperature cross-linking process, and the temperature in said low temperature injection molding process is in a range of 70° C. to 130° C. and the temperature in said high temperature cross-linking process is in a range of 120'C. to 200° C.

4. The fabrication method according to claim 3, wherein the temperature in said low temperature injection molding process is in a range of 100° to 120° C., and the temperature in said high temperature cross-linking process is in a range of 140° C. to 180° C.

5. The fabrication method according to claim 1, wherein said injection molding step is performed under a vibration condition.

6. The fabrication method according to claim 5, wherein said vibration condition is selected from a group consisting of mechanical vibration, sonic vibration, ultrasonic vibration and electromagnetic vibration.

7. The fabrication method according to claim 1, wherein said solar cell sheets are selected from a group consisting of single silicon solar cell sheets, polysilicon solar cell sheets, amorphous silicon solar cell sheets, potassium arsenide solar cell sheets, cadmium telluride solar cell sheets, copper indium selenium solar cell sheets, copper indium gallium selenium solar cell sheets and dye sensitized solar cell sheets.

8. The fabrication method according to claim 1, wherein said substrate is selected from a group consisting of a glass substrate, a polymer substrate, a plastic substrate, a stainless steel substrate, an aluminum substrate and a composite material.

9. The fabrication method according to claim 1, wherein said back sheet is selected from a group consisting of a glass substrate, a polymer substrate, a plastic substrate, a stainless steel substrate, an aluminum substrate and a composite material.

10. The fabrication method according to claim 1, further comprising encapsulating said solar cell assembly with a side wall encapsulation material.

11. The fabrication method according to claim 10, wherein said side wall encapsulation material is selected from a group consisting of organic silicone gels and a butyl rubber sealing strip.

* * * * *